US009899959B2

(12) United States Patent
Feiginov et al.

(10) Patent No.: US 9,899,959 B2
(45) Date of Patent: Feb. 20, 2018

(54) ELEMENT, AND OSCILLATOR AND INFORMATION ACQUIRING DEVICE INCLUDING THE ELEMENT

(71) Applicant: CANON KABUSHIKI KAISHA, Tokyo (JP)

(72) Inventors: Michael Feiginov, Tokyo (JP); Yasushi Koyama, Kamakura (JP)

(73) Assignee: Canon Kabushiki Kaisha, Tokyo (JP)

( * ) Notice: Subject to any disclaimer, the term of this patent is extended or adjusted under 35 U.S.C. 154(b) by 94 days.

(21) Appl. No.: 15/151,765

(22) Filed: May 11, 2016

(65) Prior Publication Data

US 2016/0344343 A1 Nov. 24, 2016

(30) Foreign Application Priority Data

May 22, 2015 (JP) ................................ 2015-105012
May 6, 2016 (JP) ................................ 2016-093082

(51) Int. Cl.
*H03B 7/08* (2006.01)
*H01L 29/88* (2006.01)
(Continued)

(52) U.S. Cl.
CPC ........... *H03B 7/08* (2013.01); *G01R 31/2831* (2013.01); *G01R 31/311* (2013.01); *H01L 23/66* (2013.01);
(Continued)

(58) Field of Classification Search
CPC ........... H03B 7/08; H03B 7/12; H01L 29/882; H01L 29/0657; H01L 29/155; H01L 23/66; H01L 2223/6627; H01L 2223/6677; G01R 31/311; G01R 31/2831; H01Q 1/38; H01Q 9/16; H01Q 9/30
(Continued)

(56) References Cited

U.S. PATENT DOCUMENTS 7,924,107 B2 4/2011 Koyama et al.
8,779,864 B2 * 7/2014 Ouchi ...................... H03B 9/12 331/107 T (Continued)

OTHER PUBLICATIONS

Asada, et al, "Resonant Tunneling Diodes for Sub-Terahertz and Terahertz Oscillators", Japanese Journal of Appl. Phys., vol. 47, No. 6 (2008), pp. 4375-4384.

*Primary Examiner* — Arnold Kinkead
(74) *Attorney, Agent, or Firm* — Fitzpatrick, Cella, Harper & Scinto

(57) ABSTRACT

An element, including: a first conductor layer extending in a first direction; a second conductor layer extending in the first direction; and a semiconductor disposed between the first and second conductor layers, the semiconductor including: a first semiconductor layer in contact with the first conductor layer; a second semiconductor layer in contact with the second conductor layer; and an active layer disposed between the first and second semiconductor layers, in which: the semiconductor has a width of 0.5 μm or more and 5 μm or less in a direction intersecting the first and second directions, and has a thickness of 0.1 μm or more and 1.0 μm or less in the second direction; the active layer includes a double-barrier resonant tunnel diode; and each of the two barrier layers has a thickness of 0.7 nm or more and 2.0 nm or less in the second direction.

11 Claims, 7 Drawing Sheets

(51) Int. Cl.

| | |
|---|---|
| ***H01L 29/06*** | (2006.01) |
| ***H01L 23/66*** | (2006.01) |
| ***H01L 29/15*** | (2006.01) |
| ***H01L 29/205*** | (2006.01) |
| ***H01Q 1/38*** | (2006.01) |
| ***H01Q 9/16*** | (2006.01) |
| ***H03B 7/12*** | (2006.01) |
| ***G01R 31/311*** | (2006.01) |
| ***H01Q 9/30*** | (2006.01) |
| ***G01R 31/28*** | (2006.01) |

(52) U.S. Cl.
CPC ........ *H01L 29/0657* (2013.01); *H01L 29/155* (2013.01); *H01L 29/205* (2013.01); *H01L 29/882* (2013.01); *H01Q 1/38* (2013.01); *H01Q 9/16* (2013.01); *H01Q 9/30* (2013.01); *H03B 7/12* (2013.01); *H01L 2223/6627* (2013.01); *H01L 2223/6677* (2013.01)

(58) Field of Classification Search
USPC ....................... 331/107 T, 96, 115, 132, 105; 343/700 MS, 751, 750; 333/219.1
See application file for complete search history.

(56) References Cited

U.S. PATENT DOCUMENTS

| | | | | |
|---|---|---|---|---|
| 8,896,389 | B2 | 11/2014 | Koyama et al. | |
| 9,184,697 | B2 | 11/2015 | Sekiguchi et al. | |
| 2007/0280319 | A1 | 12/2007 | Sekiguchi et al. | |
| 2011/0155998 | A1 * | 6/2011 | Koyama ................ | B82Y 10/00 257/13 |
| 2015/0303559 | A1 | 10/2015 | Tateishi | |
| 2016/0006215 | A1 | 1/2016 | Koyama et al. | |

* cited by examiner

| Composition | n-Doping | Thickness |
|---|---|---|
| Au | | |
| $In_{0.53}Ga_{0.47}As$ | $5\times10^{19}$ | 200nm |
| $In_{0.53}Ga_{0.47}As$ | $1.5\times10^{18}$ | 50nm |
| AlAs | undoped | $d_{bar}$ |
| $In_{0.53}Ga_{0.47}As$ | undoped | 1.2nm |
| InAs | undoped | 1.2nm |
| $In_{0.53}Ga_{0.47}As$ | undoped | 1.2nm |
| AlAs | undoped | $d_{bar}$ |
| $In_{0.53}Ga_{0.47}As$ | $1.5\times10^{18}$ | 50nm |
| $In_{0.53}Ga_{0.47}As$ | $5\times10^{19}$ | 200nm |
| Au | | |

FIG. 7
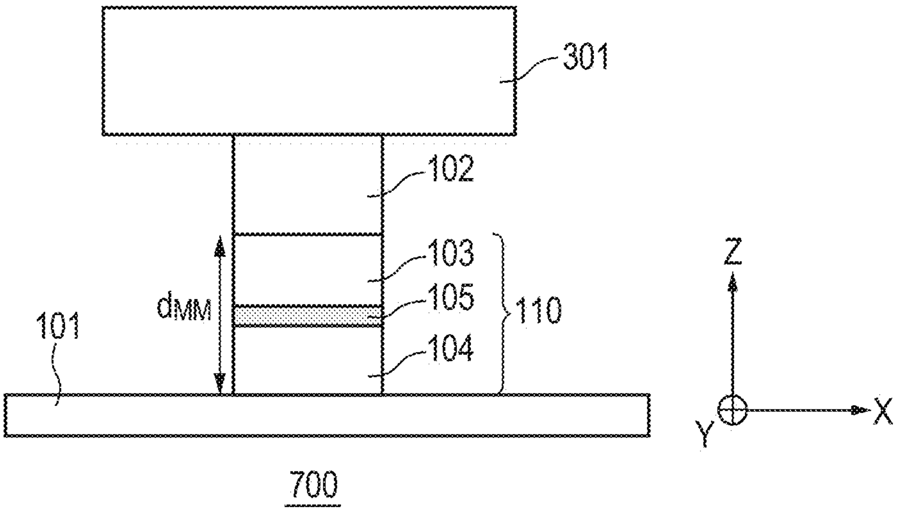
FIG. 8A
FIG. 8B
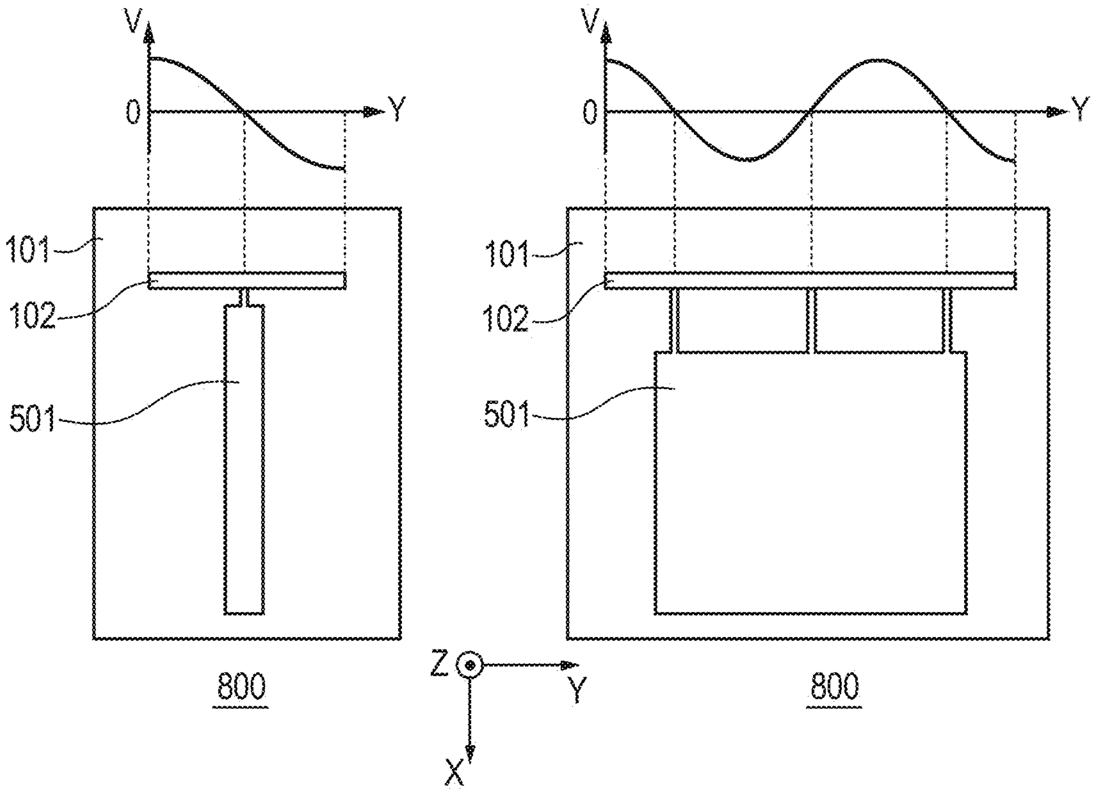

ELEMENT, AND OSCILLATOR AND INFORMATION ACQUIRING DEVICE INCLUDING THE ELEMENT

BACKGROUND OF THE INVENTION

Field of the Invention

The present invention relates to an element having a microstrip structure including an active layer, and an oscillator and an information acquiring device including the element.

Description of the Related Art

An electromagnetic wave in a terahertz frequency band approximately from 0.1 THz to 10 THz (hereinafter also referred to as a terahertz wave) can be applied to many fields. For example, many molecules and molecular complexes exhibit resonance in this frequency band. Therefore, spectrum analysis using a terahertz wave can be used for, for example, identification of various kinds of gases or substances that are not transparent to an electromagnetic wave at a frequency in a light region but are transparent to a terahertz wave. Therefore, terahertz imaging can be used for security check, quality control in a manufacturing process, and the like. Further, a terahertz wave can also be used for ultra-high speed wireless communication or the like.

For applications described above, a terahertz light source that is compact, is efficient, and operates at room temperature is desired. In recent years, a terahertz wave oscillator using an element including a resonant tunnel diode (RTD) receives attention as a promising candidate for a terahertz light source. Today, an RTD can emit a terahertz wave of up to approximately 1.8 THz. The RTD is very compact and sufficiently efficient, and thus, suitable for practical applications. Further, the RTD operates at room temperature. Those characteristics make practical applications of the RTD very attractive. However, an output power of the RTD is relatively small, which is not sufficient for many of the applications at present. This is a main weak point of the RTD.

In regards to the problem described above, in US Patent Application Publication No. 2015/0303559, the following technology is disclosed. Disclosed are some methods of emitting a terahertz wave from a microstrip waveguide connected to an antenna. Further, parameters of a waveguide with an RTD that is designed to oscillate an electromagnetic wave at approximately 0.2 THz are also disclosed.

In US Patent Application Publication No. 2007/0280319, the following technology of an active waveguide is disclosed. Disclosed is a configuration in which a passive metal-dielectric-metal waveguide is formed on a side portion of a core of the waveguide with an RTD.

In an element using the RTD, dimensions of the RTD are required to be small for the purpose of reducing the capacitance. If not, an operating frequency of the oscillator is limited. Meanwhile, in the terahertz band, the dimensions of the RTD are normally in the submicron range. When the dimensions are so small, the output power of the RTD is limited. Therefore, in order to attain higher output power in a frequency band up to the vicinity of 2 THz, it is necessary to optimize the configuration of the element including the RTD, to thereby attain both reduction in capacitance through miniaturization and securement of an electromagnetic wave gain.

SUMMARY OF THE INVENTION

According to one embodiment of the present invention, there is provided an element, including: an active layer capable of emitting an electromagnetic wave; a first conductor layer extending in a first direction; a second conductor layer extending in the first direction; and a semiconductor formed between the first conductor layer and the second conductor layer, the semiconductor including: a first semiconductor layer in contact with the first conductor layer; a second semiconductor layer in contact with the second conductor layer; and the active layer formed between the first semiconductor layer and the second semiconductor layer, in which: when a second direction represents a direction in which the first semiconductor layer, the active layer, and the second semiconductor layer are laminated; the semiconductor has a width of 0.5 μm or more and 5 μm or less in a direction intersecting the first direction and the second direction, and has a thickness of 0.1 μm or more and 1.0 μm or less in the second direction; the active layer includes a double-barrier resonant tunnel diode including two barrier layers; and each of the two barrier layers of the double-barrier resonant tunnel diode has a thickness of 0.7 nm or more and 2.0 nm or less in the second direction.

Further features of the present invention will become apparent from the following description of exemplary embodiments with reference to the attached drawings.

BRIEF DESCRIPTION OF THE DRAWINGS

FIG. 7 is a sectional view for illustrating an exemplary configuration of an element according to a second embodiment of the present invention.

FIG. 8A is an illustration of an exemplary configuration of an element according to a third embodiment of the present invention.

FIG. 8B is an illustration of another exemplary configuration of the element according to the third embodiment.

DESCRIPTION OF THE EMBODIMENTS

A propagation loss of an electromagnetic wave in a waveguide having an RTD in a core thereof is usually very large. Therefore, it is required to increase an RTD gain sufficiently large to compensate for the loss in the waveguide in a frequency band up to the vicinity of 2 THz. The present invention has been made in view of the challenge, and an object of the present invention is to provide an element in which an RTD gain is increased in at least part of a frequency region of 0.1 THz or more and 2 THz or less to enable compensation for the loss in the waveguide. Embodiments of the present invention are described below. Note that, the present invention is not limited to configurations of the embodiments described below, and various modifications are possible.

In the embodiments described below, a double-barrier resonant tunnel diode (double-barrier RTD) suitable as an active layer of an oscillator of a waveguide is included, and a configuration in which, with the double-barrier RTD, the gain exceeds the loss in the waveguide resulting in oscillation is presented.

First Embodiment

Figure 1:
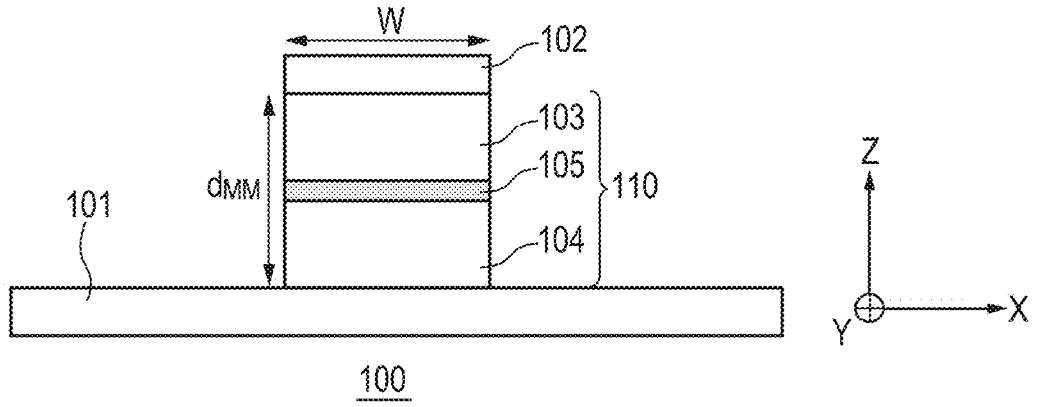
FIG. 1 is a sectional view for illustrating an exemplary configuration of an element according to a first embodiment of the present invention.

A first embodiment of the present invention relates to an element having a microstrip structure (hereinafter referred to as "microstrip"). FIG. 1 is an illustration of a section of an element 100 along a plane perpendicular to a first direction that is an extending direction of the microstrip. The element 100 has a microstrip including an upper conductor layer (first conductor layer) 102, a lower conductor layer (second conductor layer) 101, and a semiconductor 110. The semiconductor 110 includes an active layer 105, and a first semiconductor layer 103 and a second semiconductor layer 104 that sandwich the active layer 105 and that are doped with carriers.

Figure 2A:
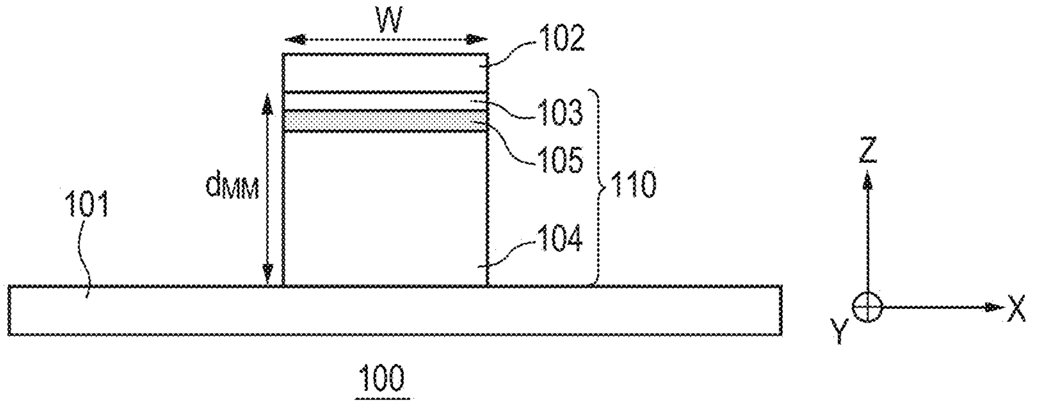
FIG. 2A is a sectional view for illustrating another exemplary configuration of the element according to the first embodiment.
Figure 2B:
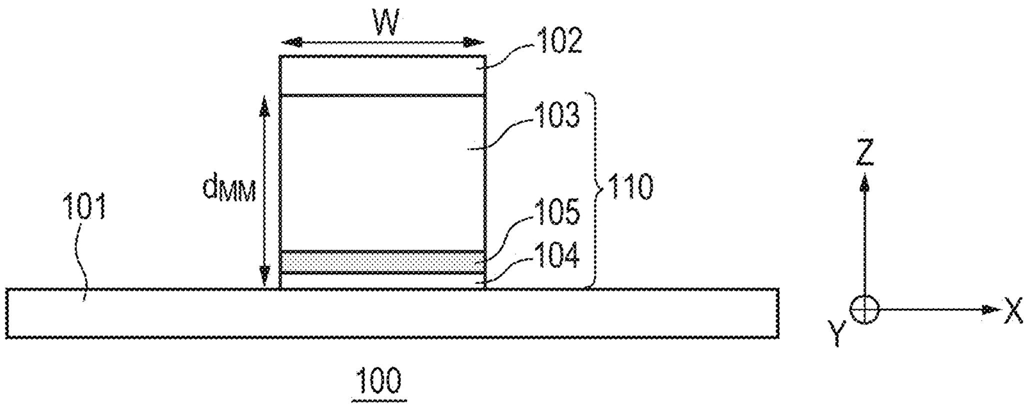
FIG. 2B is a sectional view for illustrating still another exemplary configuration of the element according to the first embodiment.

The active layer 105 may be arranged at an arbitrary location in the semiconductor 110 of the microstrip. For example, as illustrated in FIG. 1, the active layer 105 can be arranged in the vicinity of a middle portion in a second direction that is a thickness direction of the microstrip. Alternatively, as illustrated in FIG. 2A or FIG. 2B, the arrangement of the active layer 105 may be shifted to the upper conductor layer 102 side or the lower conductor layer 101 side. FIG. 2A and FIG. 2B are sectional views for illustrating other exemplary configurations of the element according to this embodiment.

Figure 3:
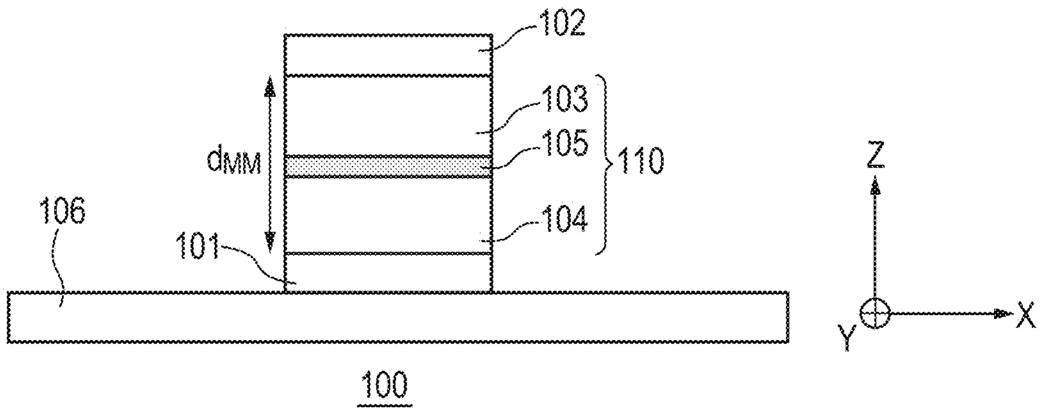
FIG. 3 is a sectional view for illustrating yet another exemplary configuration of the element according to the first embodiment.

The first semiconductor layer 103 is in contact with the upper conductor layer 102, and the second semiconductor layer 104 is in contact with the lower conductor layer 101. Each of the lower conductor layer 101 and the upper conductor layer 102 is a metal stripe. The lower conductor layer 101 may be a wide metal plate as illustrated in FIG. 1, FIG. 2A, and FIG. 2B, or, may be a narrow metal stripe having a width (width in a direction intersecting (typically, orthogonal to) the first and second directions) equivalent to a width of the second semiconductor layer 104 thereon as illustrated in FIG. 3. In the case illustrated in FIG. 3, the lower conductor layer 101 is formed on a substrate 106. Typical metals used for the lower conductor layer 101 and the upper conductor layer 102 include Au, Mo, and Cu.

Figure 4:
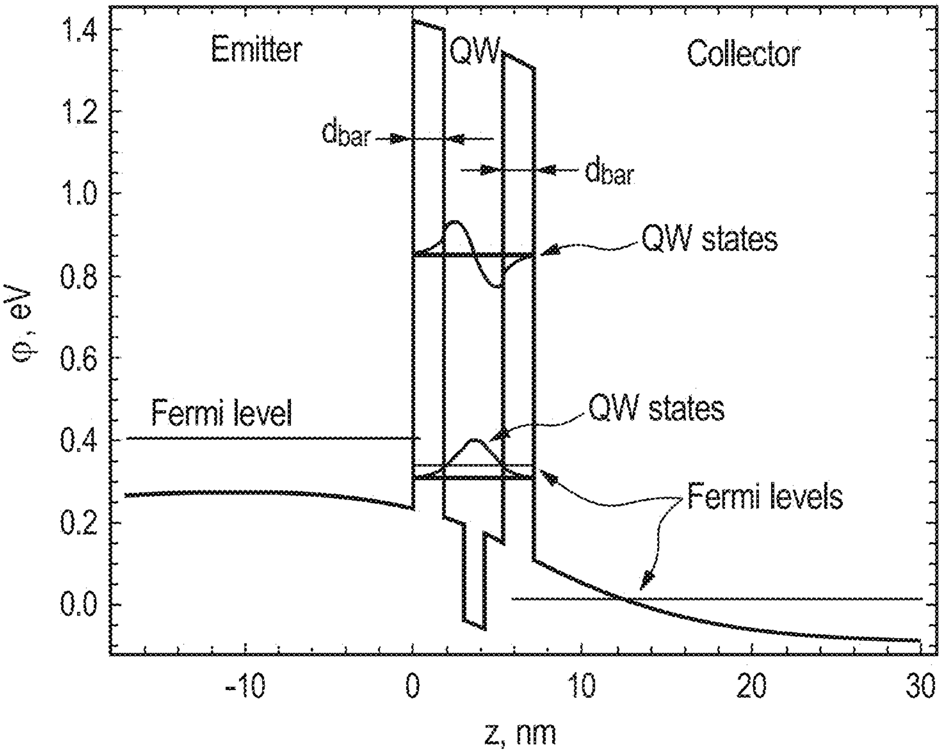
FIG. 4 is an illustration of the band structure of a double-barrier resonant tunnel diode.
Figure 5:
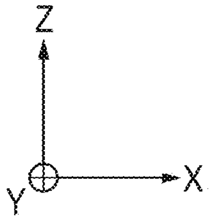
FIG. 5 is a table for showing the laminated structure of the element according to the first embodiment.

As the active layer 105, a double-barrier RTD (hereinafter sometimes simply referred to as "RTD") is used. The RTD includes a quantum well layer (QW) sandwiched between two tunnel barrier layers. Each of the barrier layers is, for example, a semiconductor layer having a large band gap. The quantum well layer is typically at least one semiconductor layer having a small band gap. The band structure, Fermi level values of the respective portions, QW states, and barrier layer gap values in the RTD 105 are illustrated in FIG. 4. FIG. 5 is a table for showing the laminated structure of semiconductor layers included in the semiconductor 110, in which compositions, carrier (n) doping concentrations, and thicknesses of the respective layers are shown. AlAs is the barrier layers, and InGaAs, InAs, and InGaAs are the quantum well layers (QWs). The RTD 105 is sandwiched between the first semiconductor layer 103 and the second semiconductor layer 104 both doped with carriers. Therefore, electrons are supplied to the RTD 105 to pass therethrough, and are then taken out of the RTD 105.

In this embodiment, a configuration is used in which the RTD is of a travelling wave type, that is, the element takes the form of a waveguide or a transmission line having an RTD in a core. In this case, it is necessary that a negative differential conductance (NDC, reciprocal of a negative differential resistance) of the RTD give amplification (gain) to the waveguide. When the gain is larger than a loss in the waveguide, the waveguide can be used as the oscillator. For the purpose of this, for example, an end surface of the waveguide is formed as an open end. Then, a waveguide having a length that is substantially equal to an integral multiple of a half wave in a waveguide mode forms a resonator with reflection at the open end. When the gain is larger than the loss in the waveguide, such a resonator oscillates at a resonance frequency.

For the purpose of analyzing the propagation properties and attenuation/gain of an electromagnetic wave in the element 100, description is made using a model of an ordinary transmission line. For the sake of simplicity of the description, it is assumed that a width W of the semiconductor 110 is far larger than a distance $d_{MM}$ between the lower conductor layer 101 and the upper conductor layer 102 (thickness of the semiconductor 110 in a "z" direction perpendicular to the lower conductor layer 101 (the second direction)). In this case, a current and an electromagnetic field in the microstrip are homogeneous in an "x" direction (width direction) and can be regarded to be localized in the semiconductor 110, the lower conductor layer 101, and the upper conductor layer 102. In the transmission line model, an admittance Y of the waveguide for a current flowing in a perpendicular direction ("z" direction) (see FIG. 1) per unit area in an "x-y" plane can be expressed as follows.

$$1/Y=1/(G_{RTD}+i\omega C_{RTD})+R_n+R_{cont1}/(1+i\omega R_{cont1}C_{cont1})+R_{cont2}/(1+i\omega R_{cont2}C_{cont2}) \qquad (1)$$

In Formula (1), ω is an angular frequency, $G_{RTD}$ and $C_{RTD}$ are a conductance and a capacitance of the RTD 105, respectively, and $R_n$ is a resistance of the n-doped first semiconductor layer 103 and second semiconductor layer 104. Further, $R_{cont1}$ and $C_{cont1}$ are a resistance and a capacitance between the lower metal layer (lower conductor layer) 101 and the n-doped layer (second semiconductor layer) 104 in ohmic contact with each other, respectively, and $R_{cont2}$ and $C_{cont2}$ are a resistance and a capacitance between the upper metal layer (upper conductor layer) 102 and the n-doped layer (first semiconductor layer) 103 in ohmic contact with each other, respectively.

An impedance Z along the metal stripe per unit length in the "y" direction and per unit width in the "x" direction is expressed as follows.

$$Z=i\omega L_{MM}+Z_{sk} \quad (2)$$

In Formula (2), $L_{MM}=4\pi\cdot d_{MM}/c^2$ (CGS unit system) is an inductance of the microstrip, $Z_{sk}$ is an impedance taking into consideration a skin effect of the lower conductor layer 101 (per unit length and unit width of the stripe), and c is the speed of light in free space. A propagation constant γ ("y" direction) of the waveguide with the RTD is expressed as follows.

$$\gamma=\sqrt{-YZ} \quad (3)$$

For the purpose of analyzing the properties of the microstrip, parameters of the structure of the RTD 105 are specified. As a representative example, the RTD 105 having the following parameters is used. As shown in FIG. 4 and FIG. 5, the RTD 105 has the following configuration. Each of the barrier layers of AlAs has a thickness $d_{bar}$. The QW between the barrier layers include three layers of InGaAs/InAs/InGaAs, and InGaAs in the QW has a composition that is lattice matched to InP. Each of the layers in the QW has a thickness of 1.2 nm, and the QW has a total thickness of 3.6 nm. The barrier layers and the QW are not intentionally doped. A layer adjacent to each of the barrier layers is InGaAs that is lattice matched to InP, and is n-doped at a concentration of approximately $1.5\times1.0^{18}$ $cm^{-3}$. The doping concentration in the first semiconductor layer 103 and the second semiconductor layer 104 at a distance of several tens of nanometers from the barrier layers, respectively, typically increases to $1.5\times1.0^{19}$ $cm^{-3}$. The RTD 105 having those parameters and the barrier layer thickness (over a wide range of approximately from 4 nm (critical thickness of the strained barrier layers) to 1 nm or less) can be actually manufactured.

Next, $G_{RTD}$ and $C_{RTD}$ of the RTD 105 are calculated. Then, using $G_{RTD}$ and $C_{RTD}$, the propagation constant of the microstrip is calculated in accordance with Formulas (1), (2), and (3). The results of the calculation are shown by the thin solid lines in FIG. 6. The thickness $d_{bar}$ of the barrier layers in the RTD 105 is 1.0 nm or more and 1.8 nm or less. The contact resistance is assumed to be 5 Ωμm². A power absorption coefficient of the microstrip is defined as $\alpha=-2\cdot\mathrm{Im}(\gamma)$. A positive value of a indicates that the waveguide loss is larger than the gain and oscillations are impossible with those parameters and frequencies. On the other hand, a negative value of α indicates that the gain is larger than the loss and the microstrip operates as an oscillator. A frequency region when a is a negative value is an operating frequency of the microstrip.

Figure 6:
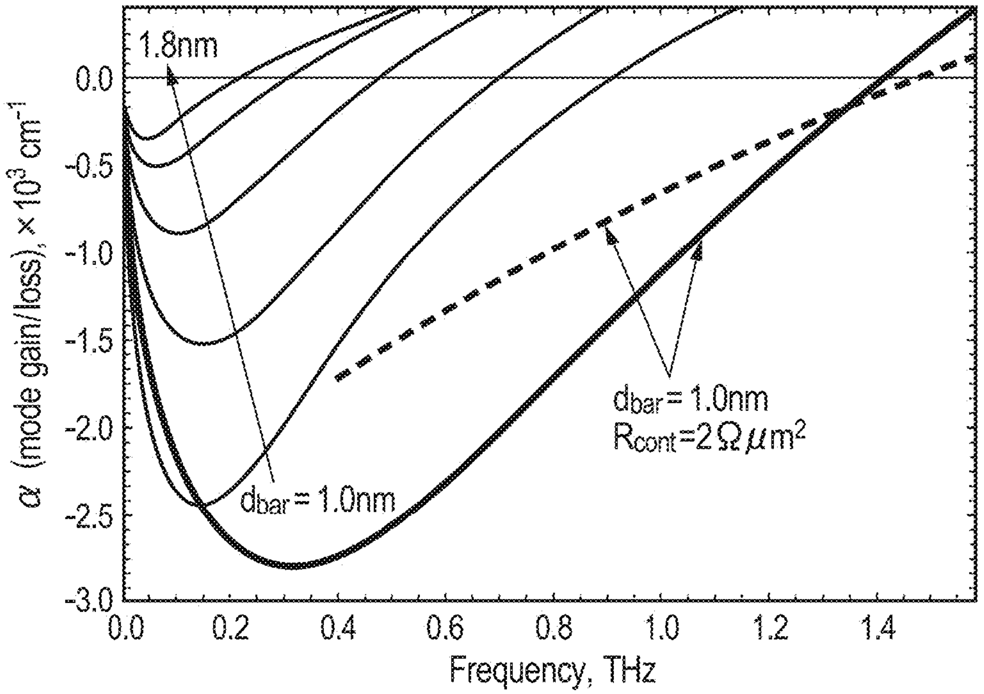
FIG. 6 is a graph for showing results of calculation of relationship between specific design values of the element and operating frequencies.

In FIG. 6, higher operating frequencies of the microstrip are shown. In a configuration having a wide stripe width ($W>>d_{MM}$), the operating frequency is approximately 0.2 THz when $d_{bar}$=1.8 nm, and approximately 0.8 THz when $d_{bar}$=1.0 nm, and operating frequencies in a range therebetween are shown in FIG. 6. The distance $d_{MM}$ between the lower conductor layer 101 and the upper conductor layer 102 is 0.5 μm, the n doping concentration of the first semiconductor layer 103 and the second semiconductor layer 104 is $5\times1.0^{19}$ $cm^{-3}$, and $R_{cont1}=R_{cont2}=R_{cont}$=5 Ωμm².

When the contact resistances are lowered so that $R_{cont1}=R_{cont2}=R_{cont}$=2 Ωμm² is satisfied, as shown by the thick solid line in FIG. 6, the operating frequency of the microstrip rises. At this time, when the parameters are as described above and $d_{bar}$=1.0 nm, the higher operating frequency rises approximately to 1.4 THz. When the contact resistance $R_{cont}$ is lowered approximately to 1 Ωμm², the operating frequency of the microstrip approaches 2 THz. The contact resistances can be reduced to 1 Ωμm² to 2 Ωμm².

Further, it can be seen with reference to FIG. 6 that, as the barrier layer thickness $d_{bar}$ in the RTD 105 becomes smaller, the operating frequency of the element 100 becomes higher, and the extent of becoming higher becomes prominently larger as the frequency becomes higher. When the results of the calculation are extrapolated to a thinner barrier layer ($d_{bar}$ of approximately 0.7 nm), the operating frequency of the element 100 is close to 2 THz.

For the purpose of analyzing the influence of change in width W on the operating frequency, microstrip mode properties are reviewed using commercially available simulation software employing a finite element method. Results of calculation when the width W is narrowed ($W=d_{MM}$=0.5 μm) are indicated by the broken line in FIG. 6. It can be seen that, when the width of the microstrip is reduced to be approximately equal to $d_{MM}$, the gain and the loss are reduced. The reason is that the electromagnetic field spreads in the air around the microstrip and the electromagnetic field is no longer localized in the semiconductor layers. However, on the higher frequency side, the difference between the thick solid line and the broken line in FIG. 6 is small, and the change depending on the width W is not so large, because the loss and the gain in the microstrip mainly reside in the semiconductor layers and the active layer. As the microstrip becomes narrower, an overlap between the fringing electromagnetic field around the microstrip and the mode of the semiconductor layers reduces. However, a mode portion in the air does not affect the loss and the gain so much. In this way, the balance between the loss and the gain is determined by the semiconductor layers and the active layer, and thus, spillover of the mode into the air (fringing electromagnetic field) does not affect much the higher frequency side.

Further increase of the barrier layer thickness in the RTD to 2 nm and/or increase of $R_{cont}$ to approximately 10 Ωμm² lowers, as can be obtained by calculation through extrapolation of the data shown in FIG. 6, the operating frequency of the microstrip to the vicinity of 0.1 THz.

The simulation described above shows that, in order to cover the frequency region of from 0.1 THz to 2 THz (0.1 THz or more and 2.0 THz or less), it is necessary that the parameters of the RTD and the microstrip be in the following ranges. Specifically, $d_{bar}$=0.7 nm to 2.0 nm (0.7 nm or more and 2.0 nm or less), $R_{cont1}$ and $R_{cont2}$ are approximately from 1 Ωμm² to 10 Ωμm² (1 Ωμm² or more and 10 Ωμm² or less), W=0.5 μm to 5 μm (0.5 μm or more and 5 μm or less), and $d_{MM}$=0.1 μm to 1.0 μm (0.1 μm or more and 1.0 μm or less). More preferably, $d_{MM}$=0.2 μm to 1.0 μm (0.2 μm or more and 1.0 μm or less). However, it is also possible to, in addition to this, further optimize the structural parameters of the RTD. For example, modification of the parameters and composition of the QW, modification of the doping concentration in the semiconductor layers around the RTD, or modification of the composition of the barrier layers can attain an even higher operating frequency. Further, optimization of a geometry and dimensions of the microstrip can also increase the operating frequency of the microstrip.

From the description above, the width W of the microstrip is limited to ones corresponding to single mode operation of the microstrip. Further, it is preferred that the microstrip be relatively narrow in order to reduce the entire current consumed by the oscillator of the microstrip. It follows that the value of W is limited to approximately 5 μm or less.

The above analysis is based on a simple transmission line model for the microstrip, and thus, shift of the RTD active layer toward the upper conductor layer 102 or toward the lower conductor layer 101 does not affect much the propagation properties of the mode of the microstrip. Therefore, the above analysis and conclusion are similarly applicable to the microstrips in forms illustrated in FIG. 2A and FIG. 2B.

From the above description, the following can also be seen. The electromagnetic field at the edge of the microstrip affects the operating frequency range only slightly. Therefore, change in width of the lower conductor layer 101 (for example, change as illustrated in FIG. 3) does not affect much the operating frequency of the microstrip with the RTD. Further, the width of the upper conductor layer 102 and the width of the lower conductor layer 101 may be shifted from the width of the semiconductor 110. The widths of the upper conductor layer 102 and the lower conductor layer 101 may be smaller or larger than the width of the semiconductor 110, and may have, other than the simple stripe shapes illustrated in FIG. 1 to FIG. 3, a more complicated geometry. Insofar as the widths of the upper conductor layer 102 and the lower conductor layer 101 remain approximately equal to the width of the semiconductor 110, the widths of the upper conductor layer 102 and the lower conductor layer 101 do not change much the contact resistance. In that case, the above description is also applicable as it is to a modified type of microstrip. Numerical limitations on the applicability are as follows. First, change in contact resistance with the first semiconductor layer 103 and with the second semiconductor layer 104 due to change in width of the upper conductor layer 102 and the lower conductor layer 101, respectively, is 30% or less. In other words, contact areas are 70% or more and 100% or less of the area of the active layer (do not fall below 70%). Further, compared to the element 100 having the simple structure as illustrated in FIG. 1, change in width and in shape of the upper conductor layer 102 and the lower conductor layer 101 only brings about change by 50% or less of a propagation constant Re ($\gamma$) of the microstrip (change by 50% or less).

In order to realize an oscillator using the element 100, it is necessary to determine a length of the microstrip in the propagation direction (first direction). When the length is an integral multiple of a half wavelength of the mode of the microstrip, resonance with a standing wave occurs. The thickness of the RTD 105 serving as the active layer is far smaller than $d_{MM}$, and thus, the mode of the microstrip has a high effective permittivity, reflection at an open end of the microstrip, which corresponds to an interface with space (having a permittivity of 1), is very strong, and the reflection coefficient is close to 1. Therefore, radiation loss at the open end is small, and the oscillation frequency of the oscillator of the microstrip having the open end spreads over an entire region of the operating frequency (region defined by $\alpha<0$).

When a matching element is used for the purpose of improving propagation of the electromagnetic wave from the microstrip to an external antenna, a loss of the microstrip resonator due to the emitted electromagnetic wave is increased. The loss limits an upper limit of the oscillation frequency of the microstrip resonator to a small value. Also in this case the upper limit of the oscillation frequency is defined by $\alpha<0$.

According to this embodiment, in at least part of the frequency region of 0.1 THz or more and 2 THz or less, the RTD gain can be increased to compensate for the loss in the waveguide.

Second Embodiment

A second embodiment of the present invention relates to an element 700 configured to operate at frequencies of 0.3 THz and 1.4 THz. This embodiment is different from the first embodiment in the shape of the upper conductor layer 102. Other configurations are similar to those of the first embodiment. Note that, in FIG. 7, like reference numerals are used to designate structural elements similar to those in the first embodiment, and detailed description thereof is omitted. For the frequency of 0.3 THz, a structure having a contact resistance of 10 $\Omega\mu m^2$ is used that is relatively large but easy to manufacture. As the active layer 105, an RTD having a relatively large barrier layer thickness ($d_{bar}$=1.4 nm) is adopted. Other parameters of the RTD (active layer) 105 are defined as shown in FIG. 5, and the band structure is illustrated in FIG. 4. The width W and the thickness $d_{MM}$ of the semiconductor 110 are 1 μm and 0.5 μm, respectively.

As described above, this embodiment is different from the first embodiment in that a third conductor layer 301 is arranged on the upper conductor layer 102 for the purpose of increasing a cross sectional area. This is for the purpose of supplying a relatively large current to the RTD 105. FIG. 7 is a sectional view for illustrating the configuration of the element 700. In this embodiment, a wide metal stripe (third conductor layer) 301 is put on the top of the upper metal stripe (upper conductor layer) 102. In such a configuration, a T-shaped metal stripe is arranged on the semiconductor 110, which is similar to an ordinary shape of a T-gate of a HEMT having a small gate length. The T shape in a HEMT and the T shape in the element 100 have the same purpose, that is, to increase the cross sectional area of the metal stripe arranged above the semiconductor 110, thereby being capable of accepting a large current in order to reduce the resistance. Meanwhile, a parasitic capacitance is minimized. For the operating frequency of 0.3 THz, the following dimensions are adopted. In the T-shaped metal stripe, a cross section of a narrow bottom portion 102 in contact with the first semiconductor layer 103 is a square of approximately 1 μm×approximately 1 μm, and a cross section of the third conductor layer 301 on a side opposite to the bottom portion is a rectangle of approximately 1 μm×approximately 6 μm. The propagation constant of the element 700 is calculated using commercially available software. A half wavelength in resonance at 0.3 THz corresponds to a length of 52 μm of the microstrip.

As another example, parameters of a resonator using an element at 1.4 THz are described. In this case, the contact resistance is lowered to 2 $\Omega\mu m^2$, and an RTD having a barrier layer thickness $d_{bar}$ of 1.0 nm is adopted. Other parameters of the RTD (active layer) are the same as those shown in FIG. 5 and FIG. 4. Further, the width W of the semiconductor layer is reduced to 0.5 μm, and the thickness $d_{MM}$ is left unchanged, that is, 0.5 μm. The upper metal stripe of the microstrip is T-shaped, but the dimensions thereof are reduced. A cross section of the portion 102 is a square of approximately 0.5 μm×approximately 0.5 μm, and a cross section of the third conductor layer 301 is a rectangle of approximately 1 μm×approximately 3 μm. As the lower metal stripe 101, a substrate having a metal film formed on a surface thereof is used. The propagation constant of the mode of the microstrip is calculated using commercially available numerical software. A half wavelength in resonance at 1.4 THz corresponds to a length of approximately 14 μm of the microstrip.

It can be seen that, from the examples described above, an element for a sub-THz frequency and an element for a frequency on the order of THz can be similarly realized. The examples are based on the structural parameters of the RTD 105, but the parameters only indicate a guideline for the design of the element. In actual design of the oscillator, adjustments are required to be made depending on the used technology, the respective parameters, and characteristics of the adopted RTD.

According to this embodiment, in at least part of the frequency region of 0.1 THz or more and 2 THz or less, the RTD gain can be increased to compensate for the loss in the waveguide.

Third Embodiment

A third embodiment of the present invention is different from the first embodiment in that an element 800 includes a bias line 501. The bias line 501 is wiring for use to apply a bias voltage to the element 800. Here, a method of connecting the bias line 501 and the microstrip structure that minimizes the influence on the oscillation of the waveguide is described.

FIG. 8A is an illustration of an exemplary configuration of the element 800. A standing wave appears in the microstrip waveguide at the resonance frequency. In the simplest case, resonance at the half wavelength occurs. This occurs when the length of the microstrip in the first direction is equal to the half wavelength. A voltage distribution along the waveguide is shown in an upper part of FIG. 8A. As illustrated in FIG. 8A, when the bias line 501 is connected to the microstrip (specifically, upper conductor layer 102) at a node of the standing wave (center in an extending direction of the microstrip), the bias line 501 does not affect the oscillating mode of the element 800.

A more complicated case is when the length of the microstrip is an integral multiple of the half wavelength of the resonance frequency. FIG. 8B is an illustration of another exemplary configuration of the element 800. In this case, as illustrated in FIG. 8B, the one or more bias lines 501 are connected to the microstrip at one or more nodes of the standing wave. A voltage distribution along the microstrip is shown in an upper part of FIG. 8B. In a lower part of FIG. 8B, it is illustrated that the bias lines 501 are connected to the microstrip at all the nodes of the resonant standing wave.

When the microstrip is connected to an antenna or an appropriate matching circuit at an end portion thereof, the reflection coefficient at the end portion of the mode of the microstrip is changed. As a result, the node of the standing wave is shifted from the open end of the microstrip. The positions of the connecting points of the bias lines 501 to the microstrip are required to be shifted so as to correspond to the positions of the nodes of the resonance of the standing wave. In general, it is necessary that the bias lines 501 be connected to the microstrip at the nodes of the standing wave. The positions of the nodes are affected not only by the properties of the microstrip but also, broadly speaking, by the state of reflection at an end portion (that is, affected by, for example, a connected antenna or matching circuit).

According to this embodiment, in at least part of the frequency region of 0.1 THz or more and 2 THz or less, the RTD gain can be increased to compensate for the loss in the waveguide.

Fourth Embodiment

Figure 9:
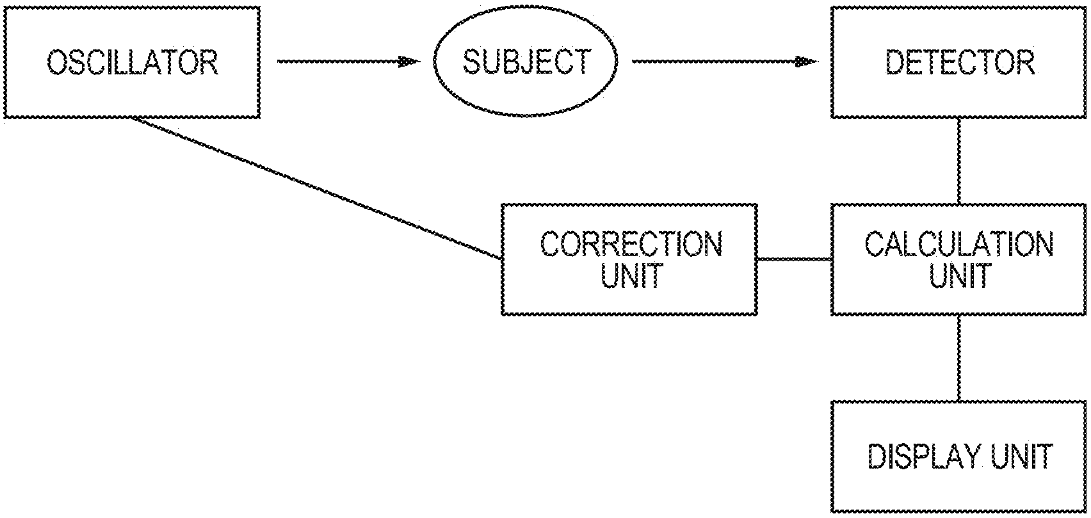
FIG. 9 is an illustration of an exemplary configuration of an information acquiring device according to a fourth embodiment of the present invention.

An information acquiring device configured to acquire information such as the state of a subject can be provided using the element described above. FIG. 9 is an illustration of an exemplary configuration of the information acquiring device. For example, the element according to any one of the embodiments described above is used as an oscillator, and a subject is arranged at an end portion of the oscillator. The subject interacts with an electromagnetic wave emitted from a waveguide, and thus, the emitted electromagnetic wave is somehow affected. The electromagnetic wave radiated to the subject is reflected therefrom or transmitted therethrough, which is detected by a detector. After that, a calculation unit such as a personal computer is used to acquire information on the subject (state or the like) from a detected signal. Specifically, application to an industrial inspection apparatus configured to inspect a state of a medication or the like is assumed. In this way, an information acquiring device configured to detect, with the detector, the electromagnetic wave from the subject irradiated with the electromagnetic wave emitted from the element can be formed. A display unit can display an image of the subject based on signals from the calculation unit. A correction unit can control the state of oscillation of the oscillator (output power, oscillation frequency, and the like) based on a signal from the calculation unit.

According to this embodiment, in at least part of the frequency region of 0.1 THz or more and 2 THz or less, the RTD gain can be increased to compensate for the loss in the waveguide. Further, formation of the information acquiring device using the element that can compensate for the loss in the waveguide enables more accurate measurement. As a result, reliability of information on the subject acquired from the result of measurement of, for example, a detected signal can be expected to be improved.

Embodiments of the present invention are described above, but the present invention is not limited thereto, and various modifications and variations that fall within the gist of the present invention are possible. For example, another semiconductor layer may be formed between the active layer 105 and the first semiconductor layer 103, or between the active layer 105 and the second semiconductor layer 104.

Fifth Embodiment

Figure 10A:
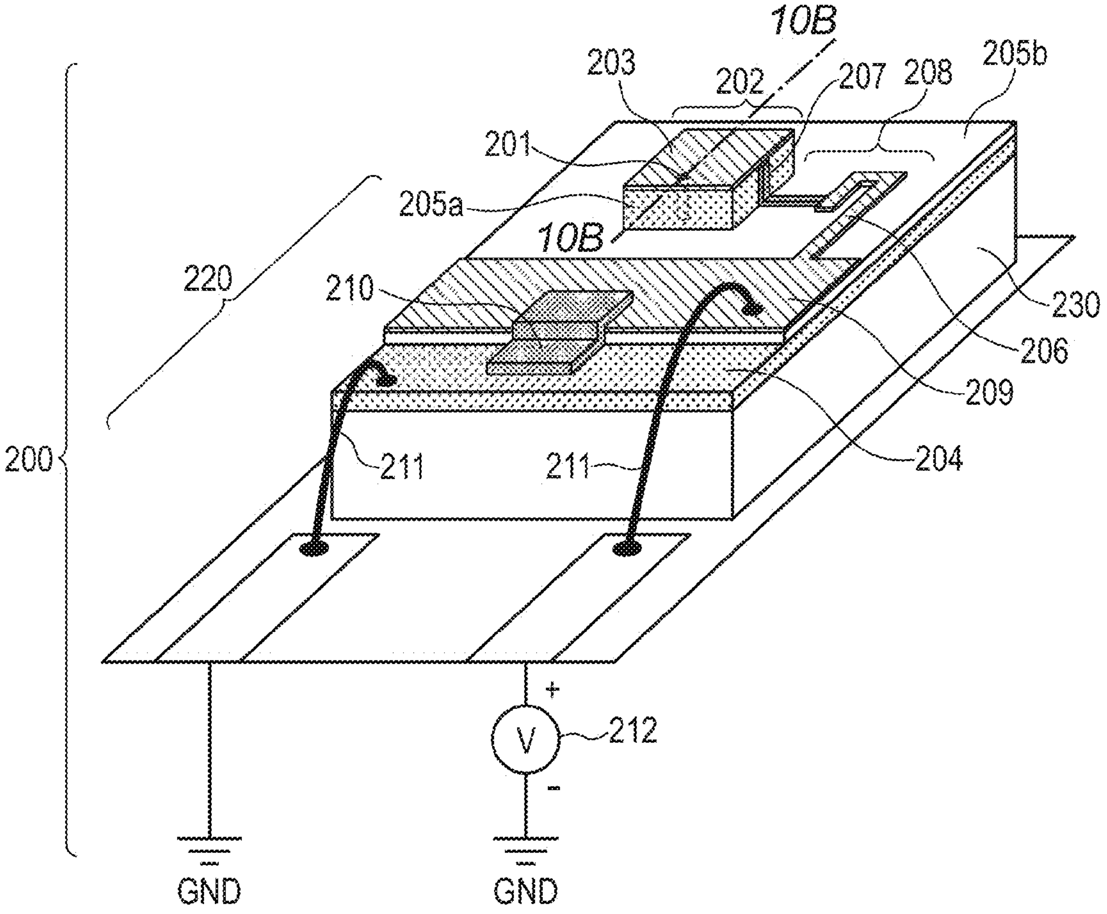
FIG. 10A is a perspective view for illustrating an exemplary configuration of an element according to a fifth embodiment of the present invention.
Figure 10B:
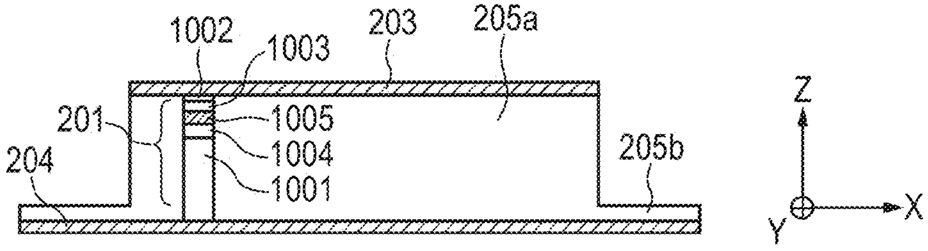
FIG. 10B is a sectional view taken along the line 10B-10B of FIG. 10A for illustrating the exemplary configuration of the element according to the fifth embodiment.

An oscillator 200 according to a fifth embodiment of the present invention is described with reference to FIG. 10A and FIG. 10B. FIG. 10A is a perspective view for illustrating an outer appearance of the oscillator 200 according to this embodiment, and FIG. 10B is a sectional view taken along the line 10B-10B of FIG. 10A.

The oscillator 200 is an active antenna in which an antenna 202 and a gain portion 201 that includes an RTD 1005 as an active layer are integrated. Therefore, an oscillation frequency $f_{THz}$ of the oscillator 200 is determined as a resonance frequency of a whole parallel resonant circuit in which a reactance of the antenna 202 and a reactance of the gain portion 201 are combined.

Specifically, from a circuit equivalent to an RTD oscillator disclosed in Jpn. J. Appl. Phys., Vol. 47, No. 6 (2008), pp. 4375-4384, with regard to a resonant circuit in which an admittance of the RTD and an admittance of the antenna ($Y_{RTD}$ and $Y_{ANT}$) are combined, a frequency that satisfies both an amplitude condition expressed by Formula (1) and a phase condition expressed by Formula (2) is determined as the oscillation frequency $f_{THz}$.

$$Re[Y_{RTD}]+Re[Y_{ANT}]\leq 0 \tag{1}$$

$$Im[Y_{RTD}]+Im[Y_{ANT}]=0 \tag{2}$$

In Formula (1), $Re[Y_{RTD}]$ is an admittance of a negative differential resistance element, and has a negative value.

The oscillator 200 includes the antenna 202, a line 208, and a bias circuit 220. The antenna 202 includes the gain portion 201, a patch conductor 203, a ground conductor 204, and a dielectric 205*a*. The gain portion 201 has the configuration described in the first embodiment. Specifically, the gain portion 201 includes the RTD 1005 serving as an active layer, semiconductor layers 1003 and 1004 that sandwich the RTD 1005 and that are doped with carriers, and conductor layers 1001 and 1002. The first semiconductor layer 1003 is connected to the first conductor layer 1002, and the second semiconductor layer 1004 is connected to the second conductor layer 1001. The second conductor layer 1001 is electrically and mechanically connected to the ground conductor 204, and the first conductor layer 1002 is electrically and mechanically connected to the patch conductor 203.

As a material used for the conductor layers 1001 and 1002, a conductor having a resistivity on the order of $10^{-6}$ Ω·m or more is used. For example, an ordinary metal or a metal compound (e.g., Ag, Au, Cu, W, Ni, Cr, Ti, Al, Au—In alloy, or TiN) or a semiconductor heavily doped with impurities to activate carriers therein, specifically, a semiconductor having a donor or acceptor doping concentration of $1\times10^{18}$ $cm^{-3}$ or more is suitably used.

In this embodiment, as the second conductor layer 1001, n-InGaAs that is a semiconductor heavily doped with carriers is used similarly to the second semiconductor layer 1004. The dopant is Si and the carrier concentration is $5\times1.0^{19}$ $cm^{-3}$. The doping concentration is high, and thus, the conductivity is close to that of a metal. When a semiconductor layer having a conductivity close to that of a metal is used as the second conductor layer 1001, from the viewpoint of loss due to series resistance, it is preferred that a width of the second conductor layer 1001 in the x direction be larger than the width W. In that case, the second conductor layer 1001 and the second semiconductor layer 1004 can be discriminated by the difference in width in the x direction. Further, similar to the first embodiment, a metal such as Au or Mo may be used as the second conductor layer 1001.

As the first conductor layer 1002, Mo, which is capable of being in low ohmic contact with InGaAs heavily doped with carriers, is used.

The semiconductor 110 according to the first embodiment includes the RTD 1005, the first semiconductor layer 1003, and the second semiconductor layer 1004. The configuration shown in FIG. 4 and FIG. 5 is used for the RTD 1005, the first semiconductor layer 1003, and the second semiconductor layer 1004 included in the semiconductor 110. From the viewpoint of loss due to series resistance, the thickness of the semiconductor 110 (that is, the total thickness of the RTD 1005, the first semiconductor layer 1003, and the second semiconductor layer 1004) is set in a range of from 0.1 μm to 1 μm (0.1 μm or more and 5 μm or less). It is more preferred that the thickness of the semiconductor 110 be set in a range of from 0.2 μm to 1 μm (0.2 μm or more and 5 μm or less).

The gain portion 201 including the RTD 1005 used in the oscillator 200 according to this embodiment has a mesa structure in which the width W in the x direction and a length in the y direction are the same. When the mesa structure is used, the shape of the mesa structure seen from the z direction may be a square, or may be a circle. Further, the width W in the x direction and the length in the y direction are not necessarily required to be the same. In this embodiment, a case in which a circular mesa structure is used is described.

Figure 11:
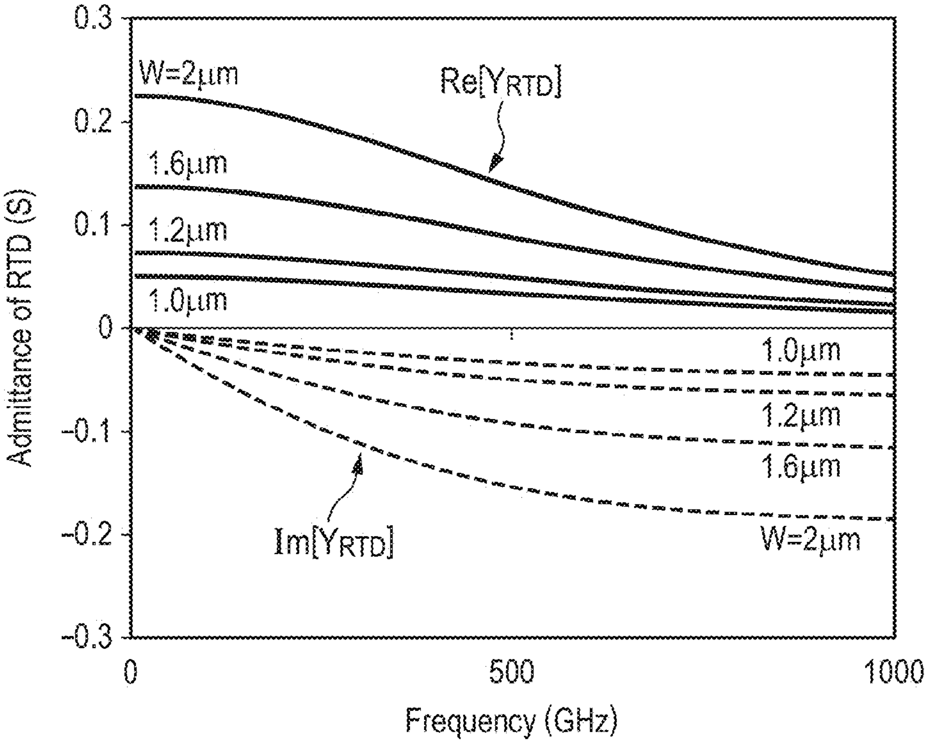
FIG. 11 is a graph for showing a result of analysis on dependence of admittance of a gain portion of the fifth embodiment on a semiconductor width W.

FIG. 11 is a graph for showing a result of an analysis on dependence of admittance of the gain portion 201 including the RTD 1005 ($Re[Y_{RTD}]$ and $Im[Y_{RTD}]$) used in this embodiment on W. In FIG. 11, the solid lines indicate $Re[Y_{RTD}]$, and the dotted lines indicate $Im[Y_{RTD}]$. Further, the RTD 1005 has a barrier layer thickness $d_{bar}$ of 1.0 nm and a contact resistance of 4 Ωμm². As the width W in the x direction increases, the gain increases, but the reactance increases as well, and thus, there is a limit to the extent of heightening the frequency. Extrapolation of the result of the analysis suggests that W=0.5 μm to 5 μm (0.5 μm or more and 5 μm or less) is the optimum width W for oscillating an electromagnetic wave having a frequency of 0.1 THz or more and 2 THz or less. A lower limit of W is determined based on whether or not the oscillation condition of Formula (1) becomes unsatisfied as the gain becomes smaller through miniaturization. Further, an upper limit of W is determined based on whether or not the oscillation frequency becomes lower and the radiation efficiency of the antenna becomes lower as the capacitance increases.

Figure 12:
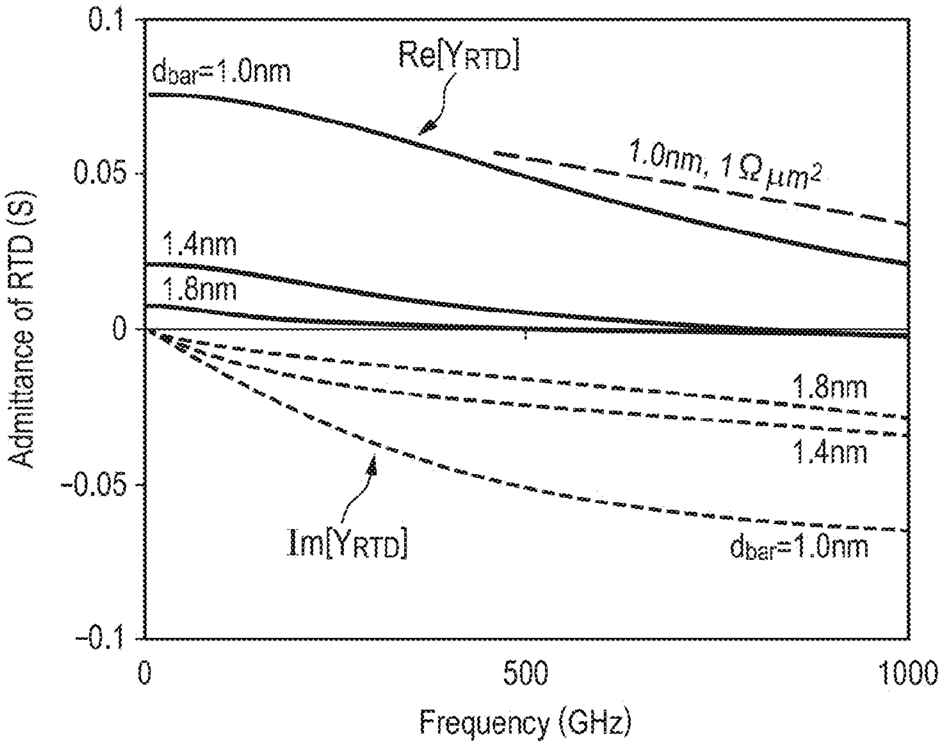
FIG. 12 is a graph for showing a result of analysis on dependence of admittance of the gain portion of the fifth embodiment on a barrier layer thickness $d_{bar}$ of an active layer.

FIG. 12 is a graph for showing a result of analysis on dependence of an admittance of the gain portion 201 including the RTD 1005 ($Re[Y_{RTD}]$ and $Im[Y_{RTD}]$) used in this embodiment on $d_{bar}$. In FIG. 12, the solid lines indicate $Re[Y_{RTD}]$, and the dotted lines indicate $Im[Y_{RTD}]$. Further, the RTD 1005 has the width W of 1.2 μm and a contact resistance of 4 Ωμm². It can be seen that, as the barrier layer thickness $d_{bar}$ of the RTD 1005 reduces, the gain becomes remarkably larger even at a high operating frequency.

Extrapolation of the result of the analysis suggests that $d_{bar}$ of approximately 0.7 nm to 2.0 nm (0.7 nm or more and 2.0 nm or less) is approximately the optimum barrier layer thickness $d_{bar}$ to obtain oscillation of from 0.1 THz to 2 THz. An upper limit of the barrier layer thickness $d_{bar}$ is determined based on whether or not, when $d_{bar}$ becomes larger than 2.0 nm, the oscillation condition of Formula (1) becomes unsatisfied as the gain becomes smaller. Further, a lower limit of the barrier layer thickness $d_{bar}$ is defined by a film thickness practically controllable by an epitaxial growth technology. Further, when $d_{bar}$=1 nm and the contact resistance is 1 Ωμm², the gain is expected to become larger in a higher frequency band as indicated by the broken line in FIG. 12. Similarly to the first embodiment, from the viewpoint of loss, the optimum contact resistance is from about 1 Ωμm² to about 10 Ωμm² (1 Ωμm² or more and 10 Ωμm² or less).

The configuration in which the dielectric 205*a* is sandwiched between the patch conductor 203 and the ground conductor 204 is of a terahertz wave resonator, and of a microstrip resonator using a limited-length microstrip line and the like. In this embodiment, a patch antenna is used as the terahertz wave resonator.

The patch antenna is formed so that the patch conductor 203 and the ground conductor 204 sandwich the dielectric 205*a*, and a width of the patch conductor 203 serving as a resonator in a direction of 10B-10B is set to λ/2. Further, the gain portion 201 is arranged between the patch conductor 203 and the ground conductor 204.

A bias circuit for supplying a bias voltage to the gain portion 201 including the RTD 1005 includes a resistor 210 connected in parallel to the gain portion 201, a capacitor 209 connected in parallel to the resistor 210, a power supply 212, and wiring 211. The power supply 212 supplies a current necessary for driving the RTD 1005 of the gain portion 201 and adjusts the bias voltage. The bias voltage is typically selected from a negative differential resistance range of the RTD 1005.

The line 208 is a distributed constant line. The bias voltage from the bias circuit 220 is supplied to the RTD 1005 via the line 208. The line 208 is a microstrip line, and has a configuration in which a strip conductor 206 and a ground conductor sandwich a dielectric 205*b*. The strip conductor 206 is connected to the patch conductor 203 via a conductor 207. The conductor 207 acts as a plug for connecting a level difference (height difference) between the patch conductor 203 and the strip conductor 206.

The conductor 207 and the line 208 are connected to a node of an electric field of a terahertz wave that is stationary in the antenna 202 and has the oscillation frequency $f_{THz}$. "A node of an electric field of a terahertz wave that is stationary in the antenna 202 and has the oscillation frequency $f_{THz}$" as used herein refers to a region that is substantially a node of an electric field of a terahertz wave that is stationary in the antenna 202 and has the oscillation frequency $f_{THz}$. In other words, the node can be said to be a region that is substantially a node of an electric field of a terahertz wave that is stationary in the patch antenna serving as a terahertz wave resonator and has the oscillation frequency $f_{THz}$. Specifically, this is a region in which the field intensity of the terahertz wave that is stationary in the antenna 202 and has the oscillation frequency $f_{THz}$ is smaller approximately by an order of magnitude than the maximum field intensity of the terahertz wave that is stationary in a resonant portion and has the oscillation frequency $f_{THz}$. A position is preferred at which the field intensity of the terahertz wave having the oscillation frequency $f_{THz}$ is $1/e^2$ (e is the base of the natural logarithm) or less of the maximum field intensity of the terahertz wave that is stationary in the antenna 202 and has the oscillation frequency $f_{THz}$.

The resistor 210 and the capacitor 209 of the bias circuit 220 suppress parasitic oscillation of a frequency band of 10 GHz from a DC from the bias circuit 220. It is preferred that the value of resistance of the resistor 210 be selected so as to be equal to or a little smaller than an absolute value of the negative differential resistance in the negative differential resistance range of the RTD 1005. Similarly to the case of the resistor 210, it is preferred that the value of capacitance of the capacitor 209 be selected so as to be equal to or a little smaller than the absolute value of the negative differential resistance of the RTD 1005 and the impedance of the element. In this embodiment, the value of capacitance is about several tens of picofarads.

The oscillator 200 according to this embodiment is designed as an oscillator configured for oscillation at the oscillation frequency $f_{THz}$ of 0.50 THz. The antenna 202 is a square patch antenna formed of the patch conductor 203 and having a side length of 150 μm. As the dielectric 205*a*, benzocyclobutene (BCB, manufactured by The Dow Chemical Company, $\epsilon_r$=2.4) having a thickness of 3 μm, and silicon nitride having a thickness of 0.1 μm are arranged between the patch conductor 203 and the ground conductor 204.

The gain portion 201 having a diameter of 1.2 μm and including the RTD 1005 is connected between the patch conductor 203 and the ground conductor 204. The gain portion 201 is arranged at a position that is shifted by 15 μm in a resonance direction from a barycenter of the patch conductor 203. The patch antenna's own resonance frequency is about 0.55 THz, but, taking into consideration the reactance of the RTD 1005 of the gain portion 201, the oscillator 200 has a oscillation frequency $f_{THz}$ of about 0.50 THz.

The microstrip line 208 has a configuration in which the dielectric 205*b* of 0.1 μm formed of silicon nitride is arranged between the strip conductor 206 and the ground conductor 204. Specific dimensions of the microstrip line 208 are as follows: a line having a width of 6 μm and a length of 100 μm extends from a connecting portion with the antenna 202, and further, a line having a width of 20 μm and an entire length of 600 μm extends. The line having a width of 20 μm and an entire length of 600 μm is connected to the MIM capacitor 209.

Note that, in the embodiments described above, a square patch is used as the terahertz wave resonator, but the shape of the resonator is not limited thereto. For example, a resonator having a configuration using a patch conductor in the shape of a polygon, e.g., a rectangle or a triangle, a circle, an ellipse, or the like may be used. Further, as the antenna 202, a slot antenna or a bowtie antenna may be used.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2015-105012, filed May 22, 2015, and 2016-093082, filed May 6, 2016 which are hereby incorporated by reference herein in their entirety.

What is claimed is:

1. An element comprising:

a first conductor layer extending in a first direction;

a second conductor layer extending in the first direction; and a semiconductor disposed between the first conductor layer and the second conductor layer, the semiconductor comprising:

a first semiconductor layer in contact with the first conductor layer;

a second semiconductor layer in contact with the second conductor layer; and an active layer disposed between the first semiconductor layer and the second semiconductor layer, wherein, when a second direction represents a direction in which the first semiconductor layer, the active layer, and the second semiconductor layer are arranged:

the semiconductor has a width of 0.5 μm or more and 5 μm or less in a direction intersecting the first direction and the second direction, and has a thickness of 0.1 μm or more and 1.0 μm or less in the second direction;

the active layer comprises a double-barrier resonant tunnel diode including two barrier layers; and each of the two barrier layers of the double-barrier resonant tunnel diode has a thickness of 0.7 nm or more and 2.0 nm or less in the second direction.

2. The element according to claim 1, wherein the semiconductor has a thickness of 0.2 μm or more and 1.0 μm or less in the second direction.

3. The element according to claim 1, wherein each of a contact resistance between the first conductor layer and the semiconductor and a contact resistance between the second conductor layer and the semiconductor is in a range of 1 $\Omega\mu m^2$ or more and 10 $\Omega\mu m^2$ or less.

4. The element according to claim 1, wherein, in a frequency range of 0.1 THz or more and 2.0 THz or less, a gain given by the double-barrier resonant tunnel diode is larger than a loss in the element.

5. The element according to claim 1, wherein at least one of the first conductor layer and the second conductor layer includes one of a metal plate and a substrate having a metal film formed on a surface thereof.

6. The element according to claim 1, wherein:

a shape of at least one of the first conductor layer and the second conductor layer is different from a shape of the semiconductor in a plane defined by the first direction and a direction of the width;

a contact area between the first conductor layer and the semiconductor is 70% or more and 100% or less of an area of the double-barrier resonant tunnel diode in the plane; and change in propagation constant of the element due to the difference in shape is 50% or less compared to a case where the first conductor layer and the semiconductor have the same shape.

7. The element according to claim 1, wherein:

at least one of the first conductor layer and the second conductor layer has a T-shaped section along a plane intersecting the first direction; and the T-shaped section includes a narrow bottom portion in contact with the semiconductor and a wide top portion on a side opposite to the narrow bottom portion.

8. The element according to claim 1, further comprising wiring for use to apply a bias voltage, wherein the wiring and the first conductor layer are connected to each other at a node of a resonant standing wave of a microstrip including the first conductor layer, the second conductor layer, and the semiconductor.

9. An oscillator, which is configured to oscillate an electromagnetic wave at a frequency of 0.1 THz or more and 2.0 THz or less, the oscillator comprising:

an element comprising:

a first conductor layer extending in a first direction;

a second conductor layer extending in the first direction; and a semiconductor disposed between the first conductor layer and the second conductor layer, the semiconductor comprising:

a first semiconductor layer in contact with the first conductor layer;

a second semiconductor layer in contact with the second conductor layer; and an active layer disposed between the first semiconductor layer and the second semiconductor layer, wherein, when a second direction represents a direction in which the first semiconductor layer, the active layer, and the second semiconductor layer are arranged:

the semiconductor has a width of 0.5 μm or more and 5 μm or less in a direction intersecting the first direction and the second direction, and has a thickness of 0.1 μm or more and 1.0 μm or less in the second direction;

the active layer comprises a double-barrier resonant tunnel diode including two barrier layers; and each of the two barrier layers of the double-barrier resonant tunnel diode has a thickness of 0.7 nm or more and 2.0 nm or less in the second direction; and a resonance structure configured to resonate an electromagnetic wave in the first direction.

10. An information acquiring device, which is configured to acquire information on a subject, the information acquiring device comprising:

an oscillator configured to emit an electromagnetic wave toward the subject; and a detector configured to detect an electromagnetic wave from the subject, the oscillator being configured to oscillate an electromagnetic wave at a frequency of 0.1 THz or more and 2.0 THz or less, the oscillator comprising:

an element comprising:

a first conductor layer extending in a first direction;

a second conductor layer extending in the first direction; and a semiconductor disposed between the first conductor layer and the second conductor layer, the semiconductor comprising:

a first semiconductor layer in contact with the first conductor layer;

a second semiconductor layer in contact with the second conductor layer; and an active layer disposed between the first semiconductor layer and the second semiconductor layer, wherein, when a second direction represents a direction in which the first semiconductor layer, the active layer, and the second semiconductor layer are arranged:

the semiconductor has a width of 0.5 μm or more and 5 μm or less in a direction intersecting the first direction and the second direction, and has a thickness of 0.1 μm or more and 1.0 μm or less in the second direction;

the active layer comprises a double-barrier resonant tunnel diode including two barrier layers; and each of the two barrier layers of the double-barrier resonant tunnel diode has a thickness of 0.7 nm or more and 2.0 nm or less in the second direction; and a resonance structure configured to resonate an electromagnetic wave in the first direction.

11. An oscillator, which is configured to oscillate an electromagnetic wave at a frequency of 0.1 THz or more and 2.0 THz or less, the oscillator comprising:

a gain portion; and an antenna configured to resonate an electromagnetic wave, the gain portion comprising:

an element comprising:

a first conductor layer extending in a first direction;

a second conductor layer extending in the first direction; and a semiconductor disposed between the first conductor layer and the second conductor layer, the semiconductor comprising:

a first semiconductor layer in contact with the first conductor layer;

a second semiconductor layer in contact with the second conductor layer; and an active layer disposed between the first semiconductor layer and the second semiconductor layer, wherein, when a second direction represents a direction in which the first semiconductor layer, the active layer, and the second semiconductor layer are arranged:

the semiconductor has a width of 0.5 μm or more and 5 μm or less in a direction intersecting the first direction and the second direction, and has a thickness of 0.1 μm or more and 1.0 μm or less in the second direction;

the active layer comprises a double-barrier resonant tunnel diode including two barrier layers; and each of the two barrier layers of the double-barrier resonant tunnel diode has a thickness of 0.7 nm or more and 2.0 nm or less in the second direction; and a resonance structure configured to resonate an electromagnetic wave in the first direction.

* * * * *